(12) United States Patent
Chang et al.

(10) Patent No.: US 8,742,836 B2
(45) Date of Patent: Jun. 3, 2014

(54) DOUBLE-SWING CLOCK GENERATOR AND CHARGE PUMP

(75) Inventors: Yen-An Chang, Miaoli County (TW); Hao-Jan Yang, Yun-Lin County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/556,182

(22) Filed: Jul. 23, 2012

(65) Prior Publication Data

US 2013/0033298 A1 Feb. 7, 2013

Related U.S. Application Data

(60) Provisional application No. 61/515,320, filed on Aug. 4, 2011.

(51) Int. Cl.
*G05F 1/10* (2006.01)

(52) U.S. Cl.
USPC .......................................................... 327/537

(58) Field of Classification Search
CPC .............................. H02M 3/073; H03K 3/537
USPC ................ 327/536, 537; 363/59, 60; 307/110
See application file for complete search history.

(56) References Cited

U.S. PATENT DOCUMENTS

2010/0308899 A1* 12/2010 Wong ............................ 327/536
2011/0133820 A1* 6/2011 Pan ............................... 327/536

* cited by examiner

*Primary Examiner* — Daniel Rojas
(74) *Attorney, Agent, or Firm* — Winston Hsu; Scott Margo (57) ABSTRACT

A double-swing clock generator includes a first double-swing clock generation circuit and a second double-swing clock generation circuit. The first double-swing clock generation circuit is used for receiving a first voltage, a second voltage, a first clock, an inverse first clock, and a third voltage, and outputting a first double-swing clock. The second double-swing clock generation circuit is used for receiving a fourth voltage, the second voltage, the first clock, the inverse first clock, and the third voltage, and outputting a second double-swing clock.

16 Claims, 5 Drawing Sheets

DOUBLE-SWING CLOCK GENERATOR AND CHARGE PUMP

CROSS REFERENCE TO RELATED APPLICATIONS

This application claims the benefit of U.S. Provisional Application No. 61/515,320, filed on Aug. 4, 2011 and entitled "Novel Charge Pump Transfer Switch with Double Swing Clock Generator," the contents of which are incorporated herein by reference.

BACKGROUND OF THE INVENTION

1. Field of the Invention

The present invention relates to a double-swing clock generator and a charge pump, and particularly to a double-swing clock generator and a charge pump that can utilize a first clock and an inverse first clock to generate a first double-swing clock and a second double-swing clock.

2. Description of the Prior Art

In the prior art, a swing of a single-swing clock generated by a single-swing clock generator is between a high voltage VCC and a low voltage (ground), where the high voltage VCC of the single-swing clock is gradually decreased with an advanced metal-oxide-semiconductor process. Therefore, when the single-swing clock generator is applied to a charge pump, the charge pump may suffer from disadvantages as follows: first, the charge pump can not maintain a good charge transfer characteristic due to gradual decrease of the high voltage of the single-swing clock; second, during power-up of the charge pump, the charge pump has a poorer ability of outputting charges; third, efficiency of a first pumping cycle of the charge pump is poorer; fourth, the charge pump may need devices with a low threshold voltage; fifth, the charge pump may need wider width devices; sixth, the charge pump may need a level shifter; seventh, the charge pump may need devices fabricated by a special semiconductor process.

To sum up, for a designer of the charge pump, it is not a good choice to apply the single-swing clock generator to the charge pump.

SUMMARY OF THE INVENTION

An embodiment provides a double-swing clock generator. The double-swing clock generator includes a first double-swing clock generation circuit, and a second double-swing clock generation circuit. The first double-swing clock generation circuit is used for receiving a first voltage, a second voltage, a first clock, an inverse first clock, and a third voltage, and outputting a first double-swing clock. The second double-swing clock generation circuit is used for receiving a fourth voltage, the second voltage, the inverse first clock, the first clock, and the third voltage, and outputting a second double-swing clock.

Another embodiment provides a charge pump. The charge pump includes a double-swing clock generator, a precharge stage pump unit, and a charge pump unit chain. The double-swing clock generator includes a first double-swing clock generation circuit, and a second double-swing clock generation circuit. The first double-swing clock generation circuit is used for receiving a first voltage, a second voltage, a first clock, an inverse first clock, and a third voltage, and outputting a first double-swing clock. The second double-swing clock generation circuit is used for receiving a fourth voltage, the second voltage, the inverse first clock, the first clock, and the third voltage, and outputting a second double-swing clock. The precharge stage pump unit is used for providing a pair of precharge pump voltages. The charge pump unit chain includes at least one charge pump unit, where the charge pump unit chain is used for receiving the first double-swing clock, the second double-swing clock, the pair of precharge pump voltages, and outputting a charge pump output voltage.

The present invention provides a double-swing clock generator and a charge pump. The double-swing clock generator and the charge pump utilize a first clock and an inverse first clock to generate a first double-swing clock and a second double-swing clock. Then, the charge pump can utilize the first double-swing clock and the second double-swing clock to control charge transfer of a charge pump unit chain. Therefore, the present invention has advantages as follows: first, when a high voltage is gradually decreased with an advanced metal-oxide-semiconductor process, the charge pump can still maintain a good charge transfer characteristic; second, during power-up of the charge pump, the charge pump has a better ability of outputting charges; third, efficiency of a first pumping cycle of the charge pump is the same as efficiency of another pumping cycle of the charge pump; fourth, the charge pump does not need devices with a low threshold voltage to overcome corner cases of a semiconductor process; fifth, the charge pump does not need wider width devices, that is, devices of the charge pump have a smaller area and a smaller parasitic capacitor, so pump efficiency of the charge pump can be increased; sixth, the charge pump does not need a level shifter; and seventh, the charge pump does not need devices fabricated by a special semiconductor process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
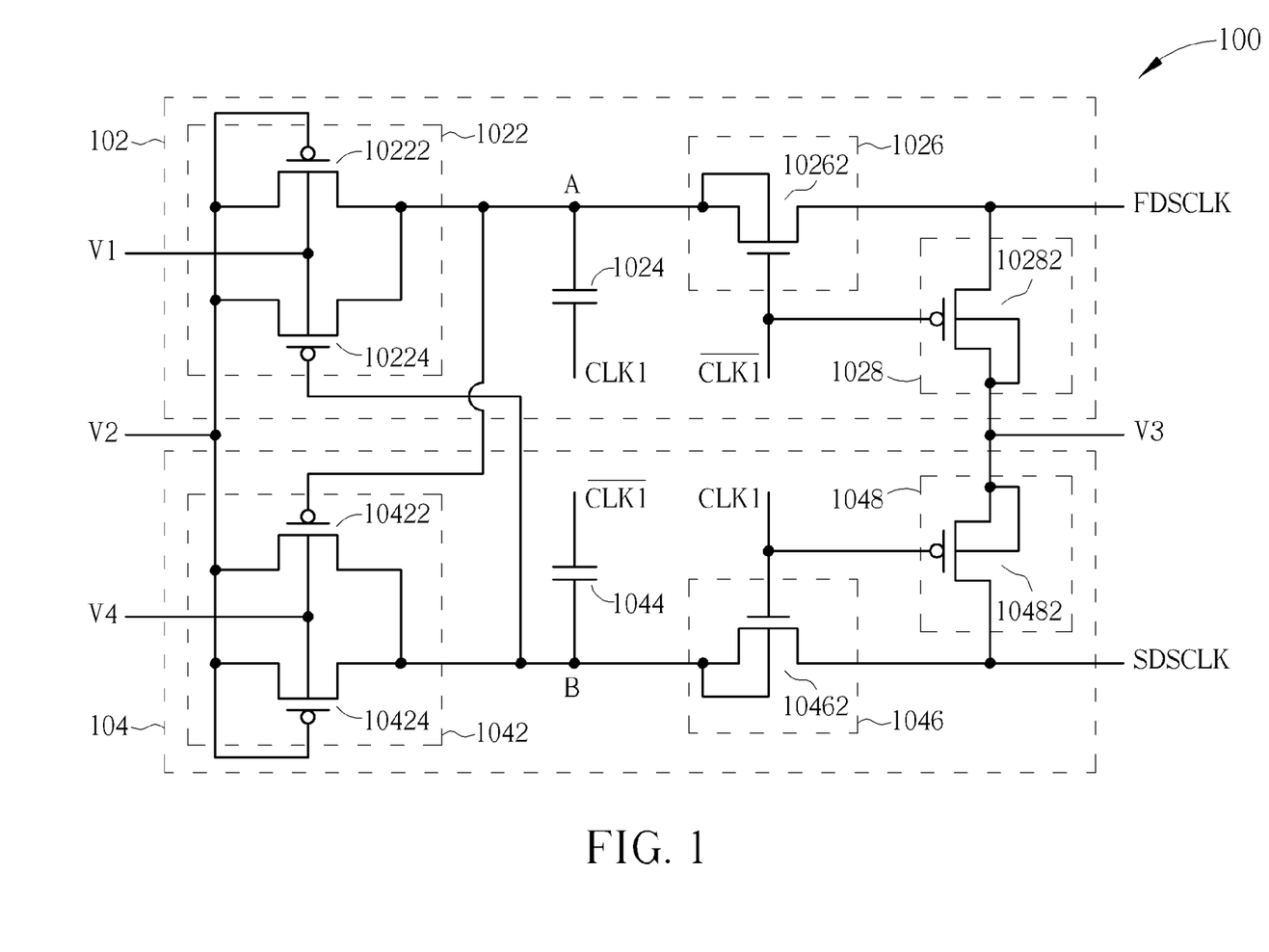
FIG. 1 is a diagram illustrating a double-swing clock generator according to an embodiment.

Please refer to FIG. 1. FIG. 1 is a diagram illustrating a double-swing clock generator 100 according to an embodiment. The double-swing clock generator 100 includes a first double-swing clock generation circuit 102, and a second double-swing clock generation circuit 104. The first double-swing clock generation circuit 102 is used for receiving a first voltage V1, a second voltage V2, a first clock CLK1, an inverse first clock CLK1, and a third voltage V3, and outputting a first double-swing clock FDSCLK, where the second voltage V2 can be a low voltage (e.g. potential of ground (0V)), the third voltage V3 can be a high voltage (e.g. a high voltage VCC), and the first voltage V1 can be the high voltage (e.g. the high voltage VCC), or the first clock CLK1. The second double-swing clock generation circuit 104 is used for receiving a fourth voltage V4, the second voltage V2, the inverse first clock $\overline{\text{CLK1}}$, the first clock CLK1, and the third voltage V3, and outputting a second double-swing clock SDSCLK, where the fourth voltage V4 can be the high voltage (e.g. the high voltage VCC) or the inverse first clock $\overline{\text{CLK1}}$.

As shown in FIG. 1, the first double-swing clock generation circuit 102 includes a first precharge unit 1022, a first capacitor 1024, a first charge transfer unit 1026, and a second precharge unit 1028, where the first precharge unit 1022 includes a first P-type metal-oxide-semiconductor transistor 10222, and a second P-type metal-oxide-semiconductor transistor 10224; the first charge transfer unit 1026 includes a first N-type metal-oxide-semiconductor transistor 10262; and the second precharge unit 1028 includes a third P-type metal-oxide-semiconductor transistor 10282. The first P-type metal-oxide-semiconductor transistor 10222 has a first terminal for receiving the second voltage V2, a second terminal coupled to the first terminal of the first P-type metal-oxide-semiconductor transistor 10222, a third terminal coupled to a first terminal of the first capacitor 1024, and a fourth terminal for receiving the first voltage V1; the second P-type metal-oxide-semiconductor transistor 10224 has a first terminal for receiving the second voltage V2, a second terminal, a third terminal coupled to the first terminal of the first capacitor 1024, and a fourth terminal for receiving the first voltage V1. The first terminal of the first capacitor 1024 is coupled to the third terminal of the first P-type metal-oxide-semiconductor transistor 10222, and a second terminal of the first capacitor 1024 is used for receiving the first clock CLK1. The first N-type metal-oxide-semiconductor transistor 10262 has a first terminal coupled to the first terminal of the first capacitor 1024, a second terminal for receiving the inverse first clock $\overline{\text{CLK1}}$, a third terminal for outputting the first double-swing clock FDSCLK, and a fourth terminal coupled to the first terminal of the first N-type metal-oxide-semiconductor transistor 10262. The third P-type metal-oxide-semiconductor transistor 10282 has a first terminal coupled to the third terminal of the first N-type metal-oxide-semiconductor transistor 10262, a second terminal coupled to the second terminal of the first N-type metal-oxide-semiconductor transistor 10262, a third terminal for receiving the third voltage V3, and a fourth terminal coupled to the third terminal of the third P-type metal-oxide-semiconductor transistor 10282.

As shown in FIG. 1, the second double-swing clock generation circuit 104 includes a third precharge unit 1042, a second capacitor 1044, a second charge transfer unit 1046, and a fourth precharge unit 1048, where the third precharge unit 1042 includes a fourth P-type metal-oxide-semiconductor transistor 10422, and a fifth P-type metal-oxide-semiconductor transistor 10424; the second charge transfer unit 1046 includes a second N-type metal-oxide-semiconductor transistor 10462; and the fourth precharge unit 1048 includes a sixth P-type metal-oxide-semiconductor transistor 10482. The fourth P-type metal-oxide-semiconductor transistor 10422 has a first terminal for receiving the second voltage V2, a second terminal, a third terminal coupled to a first terminal of the second capacitor 1044, and a fourth terminal for receiving the fourth voltage V4. The fifth P-type metal-oxide-semiconductor transistor 10424 has a first terminal for receiving the second voltage V2, a second terminal coupled to the first terminal of the fifth P-type metal-oxide-semiconductor transistor 10424, a third terminal coupled to the first terminal of the second capacitor 1044, and a fourth terminal for receiving the fourth voltage V4. The first terminal of the second capacitor 1044 is coupled to the third terminal of the fourth P-type metal-oxide-semiconductor transistor 10422, and a second terminal for receiving the inverse first clock $\overline{\text{CLK1}}$. The second N-type metal-oxide-semiconductor transistor 10462 has a first terminal coupled to the first terminal of the second capacitor 1044, a second terminal for receiving the first clock $\overline{\text{CLK1}}$, a third terminal for outputting the second double-swing clock SDSCLK, and a fourth terminal coupled to the first terminal of the second N-type metal-oxide-semiconductor transistor 10462. The sixth P-type metal-oxide-semiconductor transistor 10482 has a first terminal for receiving the third voltage V3, a second terminal coupled to the second terminal of the second N-type metal-oxide-semiconductor transistor 10462, a third terminal coupled to the third terminal of the second N-type metal-oxide-semiconductor transistor 10462, and a fourth terminal coupled to the first terminal of the sixth P-type metal-oxide-semiconductor transistor 10482.

In addition, as shown in FIG. 1, the second terminal of the second P-type metal-oxide-semiconductor transistor 10224 is coupled to the third terminal of the fourth P-type metal-oxide-semiconductor transistor 10422, and the second terminal of the fourth P-type metal-oxide-semiconductor transistor 10422 is coupled to the third terminal of the first P-type metal-oxide-semiconductor transistor 10222.

Figure 2:
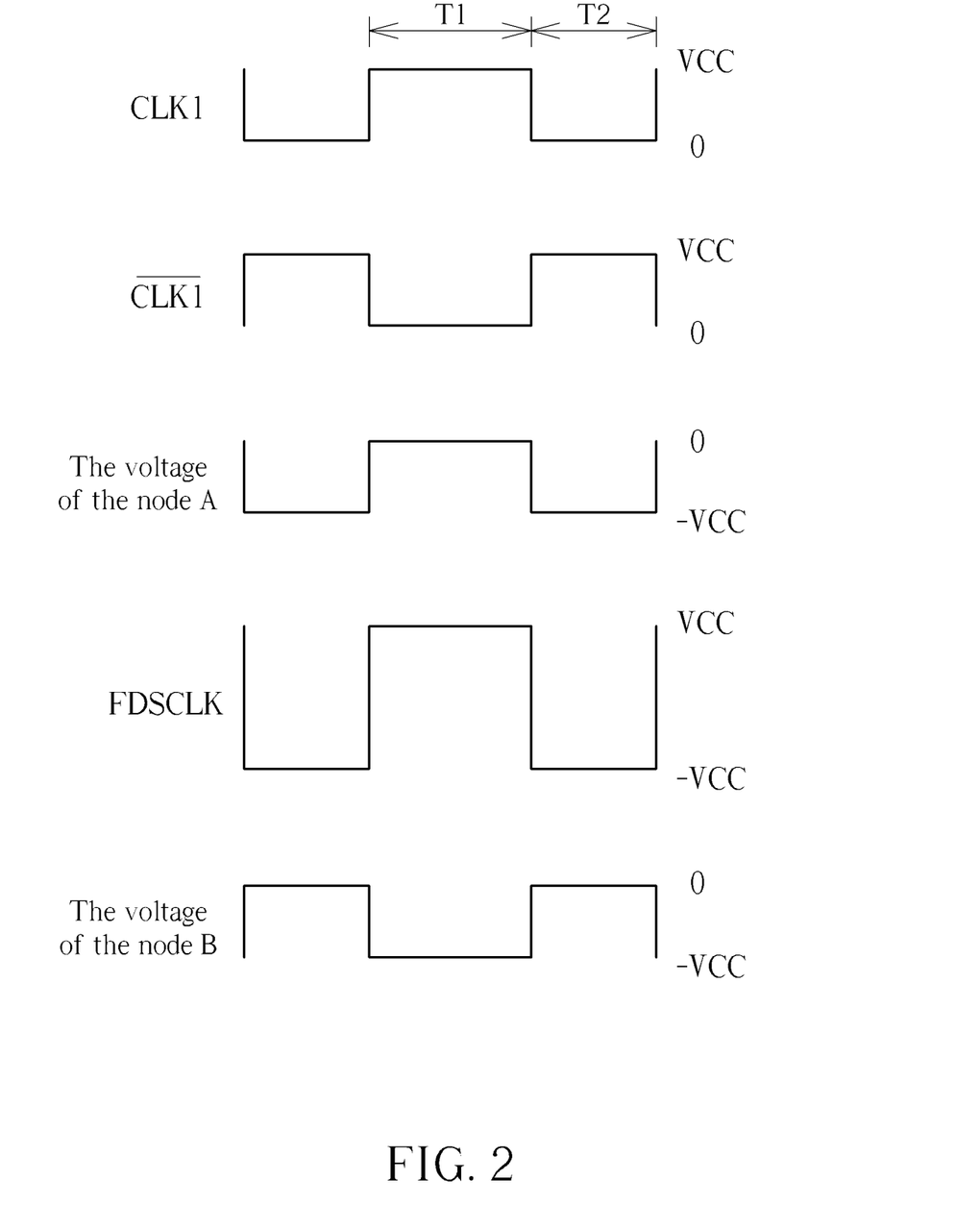
FIG. 2 is a timing diagram illustrating the first clock, the inverse first clock, a voltage of a node A, a voltage of a node B, and the first double-swing clock in FIG. 1.

Please refer to FIG. 2. FIG. 2 is a timing diagram illustrating the first clock CLK1, the inverse first clock $\overline{\text{CLK1}}$, a voltage of a node A (the first terminal of the first capacitor 1024), a voltage of a node B (the first terminal of the second capacitor 1044), and the first double-swing clock FDSCLK in FIG. 1. As shown in FIG. 1 and FIG. 2, at a period T1 (a precharge period of the double-swing clock generator 100), the first clock $\overline{\text{CLK1}}$ is at the high voltage VCC and the inverse first clock CLK1 is at the low voltage 0V. Meanwhile, because the voltage of the node B is at a first low voltage −VCC, the second P-type metal-oxide-semiconductor transistor 10224 is turned on, resulting in the second voltage V2 being transmitted to the node A. That is to say, the voltage of the node A is at the 0V. Meanwhile, the first capacitor 1024 stores a voltage drop (VCC). In addition, as shown in FIG. 1 and FIG. 2, because the inverse first clock $\overline{\text{CLK1}}$ is at the low voltage 0V, the first N-type metal-oxide-semiconductor transistor 10262 is turned off and the third P-type metal-oxide-semiconductor transistor 10282 is turned on, resulting in the third voltage V3 being transmitted to the third terminal of the first N-type metal-oxide-semiconductor transistor 10262. That is to say, the first double-swing clock FDSCLK is at the high voltage VCC. As shown in FIG. 1 and FIG. 2, at a period T2 (a pumping period of the double-swing clock generator 100), the first clock CLK1 is at the low voltage 0V and the inverse first clock $\overline{\text{CLK1}}$ is at the high voltage VCC. Because the first capacitor 1024 stores the voltage drop (VCC), when the first clock CLK1 is changed from the high voltage VCC to the low voltage 0V, the voltage of the node A can be reduced to the first low voltage −VCC to maintain the voltage drop (VCC) stored in the first capacitor 1024. In addition, because the voltage of node B is at the low voltage 0V and the voltage of the node A is at the first low voltage −VCC, the first P-type metal-oxide-semiconductor transistor 10222 and the second P-type metal-oxide-semiconductor transistor 10224 are turned off. In addition, as shown in FIG. 1 and FIG. 2, because the inverse first clock $\overline{\text{CLK1}}$ is at the high voltage VCC, the first N-type metal-oxide-semiconductor transistor 10262 is turned on and the third P-type metal-oxide-semiconductor transistor 10282 is turned off, resulting in the voltage of the node A (−VCC) being transmitted to the third terminal of the first N-type metal-oxide-semiconductor transistor 10262. That is to say, the first double-swing clock FDSCLK is at the first low voltage −VCC. Thus, a swing of the first double-swing clock FDSCLK is equal to 2VCC. That is to say, a low voltage level of the first double-swing clock FDSCLK is at the first low voltage −VCC, and a high voltage level of the first double-swing clock FDSCLK is at the high voltage VCC. In addition, operational principles of the second double-swing clock SDSCLK are the same as those of the first double-swing clock FDSCLK, so further description thereof is omitted for simplicity.

In addition, in another embodiment of the present invention, the second terminal of the second P-type metal-oxide-semiconductor transistor 10224 is used for coupling to a second output terminal of a charge pump unit of a charge pump unit chain, and the second terminal of the fourth P-type metal-oxide-semiconductor transistor 10422 is used for coupling to a first output terminal of the charge pump unit.

Figure 3:
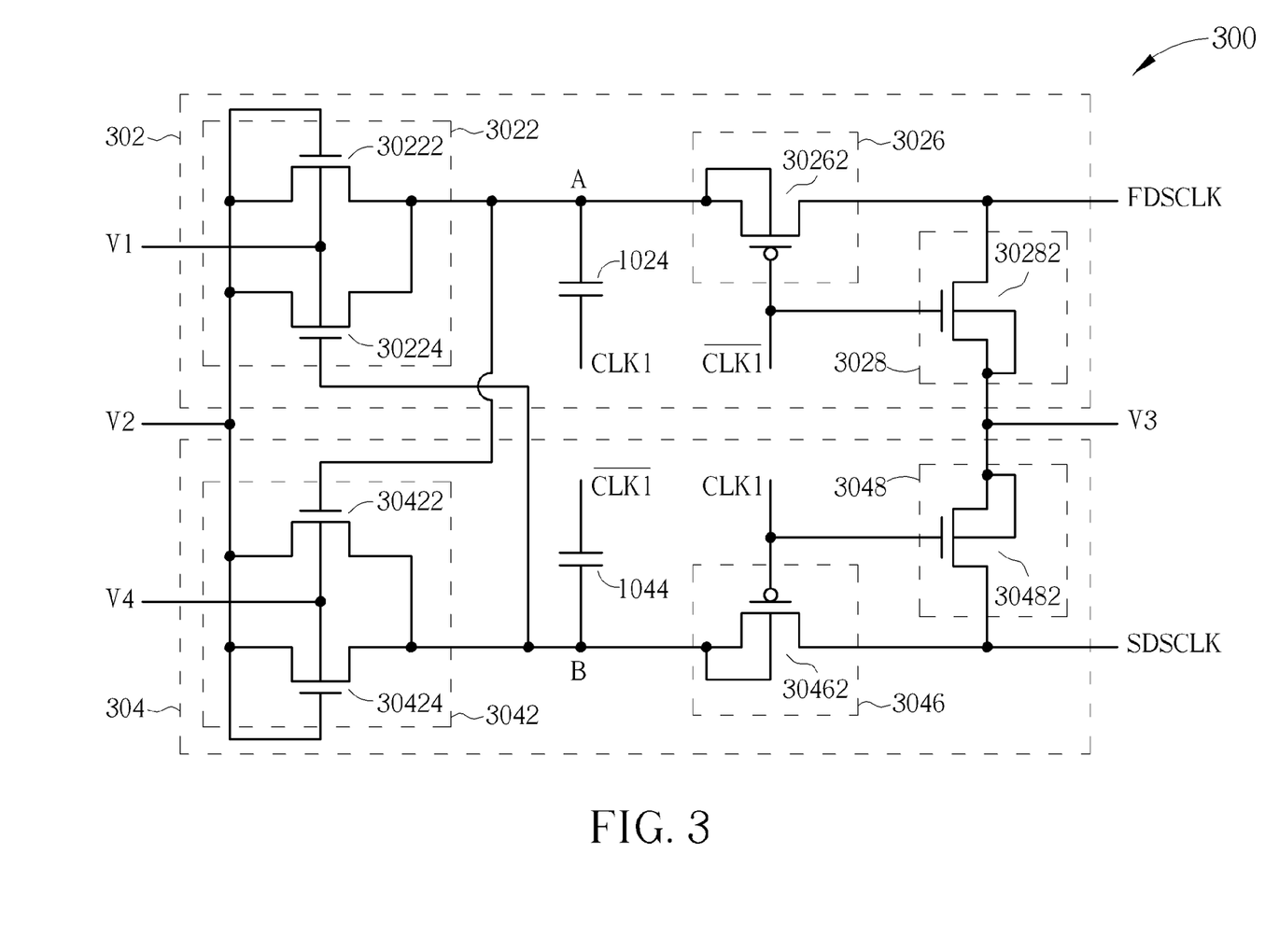
FIG. 3 is a diagram illustrating a double-swing clock generator according to another embodiment.

Please refer to FIG. 3. FIG. 3 is a diagram illustrating a double-swing clock generator 300 according to another embodiment. The double-swing clock generator 300 includes a first double-swing clock generation circuit 302, and a second double-swing clock generation circuit 304. The first double-swing clock generation circuit 302 is used for receiving a first voltage V1, a second voltage V2, a first clock CLK1, an inverse first clock $\overline{CLK1}$, and a third voltage V3, and outputting a first double-swing clock FDSCLK, where the second voltage V2 can be the high voltage (e.g. the high voltage VCC), the third voltage V3 can be the low voltage (e.g. the potential of ground (0V)), and the first voltage V1 can be the low voltage (e.g. the potential of ground (0V)), or the first clock CLK1. The second double-swing clock generation circuit 104 is used for receiving a fourth voltage V4, the second voltage V2, the inverse first clock $\overline{CLK1}$, the first clock CLK1, and the third voltage V3, and outputting a second double-swing clock SDSCLK, where the fourth voltage V4 can be the low voltage (e.g. the potential of ground (0V)), or the inverse first clock $\overline{CLK1}$.

As shown in FIG. 3, the first double-swing clock generation circuit 302 includes a first precharge unit 3022, a first capacitor 1024, a first charge transfer unit 3026, and a second precharge unit 3028, where the first precharge unit 3022 includes a third N-type metal-oxide-semiconductor transistor 30222, and a fourth N-type metal-oxide-semiconductor transistor 30224; the first charge transfer unit 3026 includes a seventh P-type metal-oxide-semiconductor transistor 30262; the second precharge unit 3028 includes a fifth N-type metal-oxide-semiconductor transistor 30282. The third N-type metal-oxide-semiconductor transistor 30222 has a first terminal for receiving the second voltage V2, a second terminal coupled to the first terminal of the third N-type metal-oxide-semiconductor transistor 30222, a third terminal coupled to the first terminal of the first capacitor 1024, and a fourth terminal for receiving the first voltage V1. The fourth N-type metal-oxide-semiconductor transistor 30224 has a first terminal for receiving the second voltage V2, a second terminal, a third terminal coupled to the first terminal of the first capacitor 1024, and a fourth terminal for receiving the first voltage V1. The first terminal of the first capacitor 1024 is coupled to the third terminal of the third N-type metal-oxide-semiconductor transistor 30222, and a second terminal for receiving the first clock CLK1. The seventh P-type metal-oxide-semiconductor transistor 30262 has a first terminal coupled to the first terminal of the first capacitor 1024, a second terminal for receiving the inverse first clock $\overline{CLK1}$, a third terminal for outputting the first double-swing clock FDSCLK, and a fourth terminal coupled to the first terminal of the seventh P-type metal-oxide-semiconductor transistor 30262. The fifth N-type metal-oxide-semiconductor transistor 30282 has a first terminal coupled to the third terminal of the seventh P-type metal-oxide-semiconductor transistor 30262, a second terminal coupled to the second terminal of the seventh P-type metal-oxide-semiconductor transistor 30262, a third terminal for receiving the third voltage V3, and a fourth terminal coupled to the third terminal of the fifth N-type metal-oxide-semiconductor transistor 30282.

As shown in FIG. 3, the second double-swing clock generation circuit 304 includes a third precharge unit 3042, a second capacitor 1044, a second charge transfer unit 3046, and a fourth precharge unit 3048, where the third precharge unit 3042 includes a sixth N-type metal-oxide-semiconductor transistor 30422, and a seventh N-type metal-oxide-semiconductor transistor 30424; the second charge transfer unit 3046 includes an eighth P-type metal-oxide-semiconductor transistor 30462; and the fourth precharge unit 3048 includes an eighth N-type metal-oxide-semiconductor transistor 30482. The sixth N-type metal-oxide-semiconductor transistor 30422 has a first terminal for receiving the second voltage V2, a second terminal, a third terminal coupled to the first terminal of the second capacitor 1044, and a fourth terminal for receiving the fourth voltage V4. The seventh N-type metal-oxide-semiconductor transistor 30424 has a first terminal for receiving the second voltage V2, a second terminal coupled to the first terminal of the seventh N-type metal-oxide-semiconductor transistor 30424, a third terminal coupled to the first terminal of the second capacitor 1044, and a fourth terminal for receiving the fourth voltage V4. The second capacitor 1044 has a first terminal coupled to the third terminal of the sixth N-type metal-oxide-semiconductor transistor 30422, and a second terminal for receiving the inverse first clock CLK1. The eighth P-type metal-oxide-semiconductor transistor 30462 has a first terminal coupled to the first terminal of the second capacitor 1044, a second terminal for receiving the first clock $\overline{CLK1}$, a third terminal for outputting the second double-swing clock SDSCLK, and a fourth terminal coupled to the first terminal of the eighth P-type metal-oxide-semiconductor transistor 30462. The eighth N-type metal-oxide-semiconductor transistor 30482 has a first terminal for receiving the third voltage V3, a second terminal coupled to the second terminal of the eighth P-type metal-oxide-semiconductor transistor 30462, a third terminal coupled to the third terminal of the eighth P-type metal-oxide-semiconductor transistor 30462, and a fourth terminal coupled to the first terminal of the eighth N-type metal-oxide-semiconductor transistor 30482.

In addition, as shown in FIG. 3, the second terminal of the fourth N-type metal-oxide-semiconductor transistor 30224 is coupled to the third terminal of the sixth N-type metal-oxide-semiconductor transistor 30422' and the second terminal of the sixth N-type metal-oxide-semiconductor transistor 30422 is coupled to the third terminal of the third N-type metal-oxide-semiconductor transistor 30222.

Figure 4:
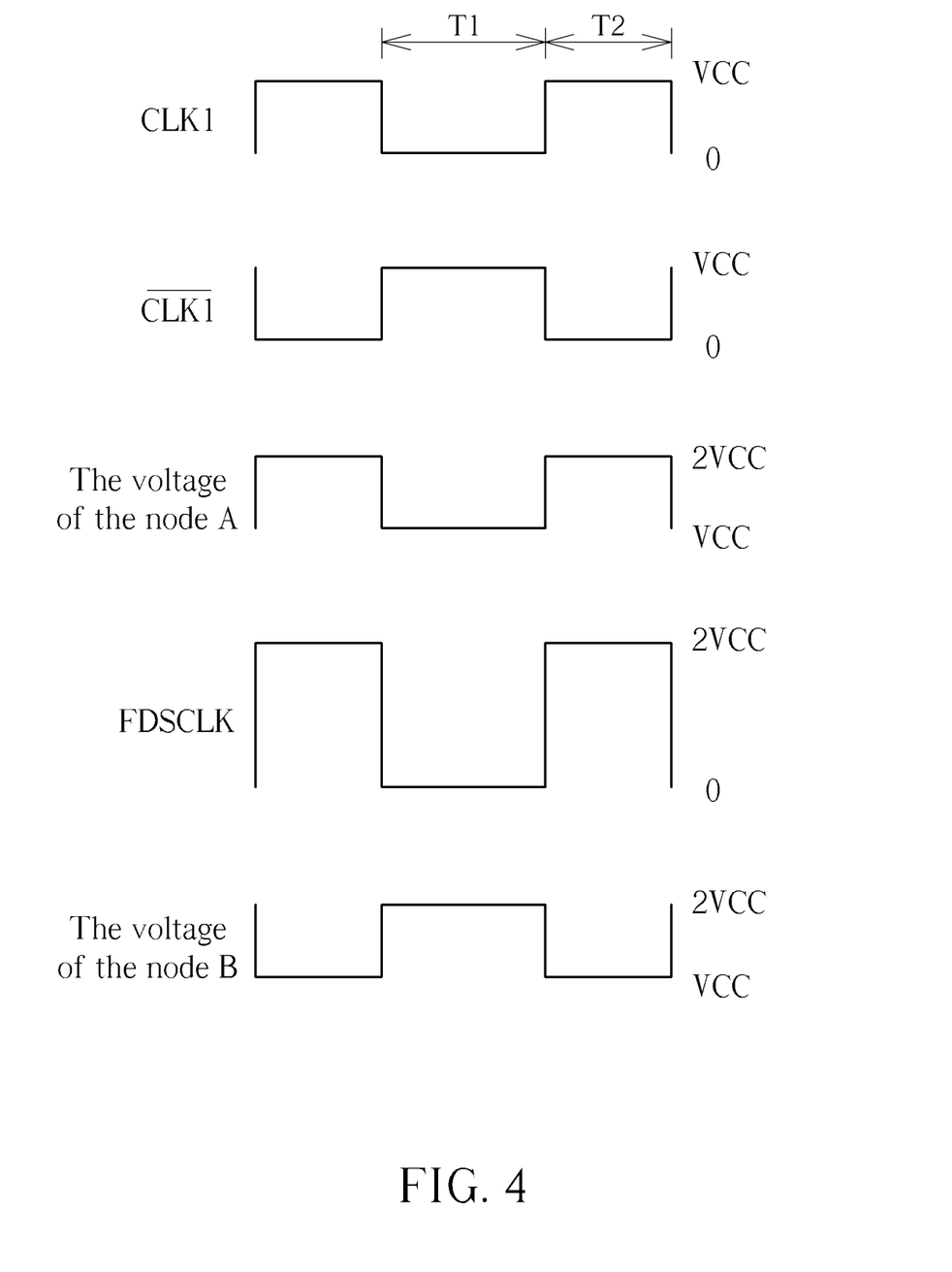
FIG. 4 is a timing diagram illustrating the first clock, the inverse first clock, a voltage of the node A, a voltage of node B, the first double-swing clock in FIG. 3.

Please refer to FIG. 4. FIG. 4 is a timing diagram illustrating the first clock CLK1, the inverse first clock $\overline{CLK1}$, a voltage of the node A, a voltage of node B, the first double-swing clock FDSCLK in FIG. 3. As shown in FIG. 3 and FIG. 4, at a period T1 (a precharge period of the double-swing clock generator 300), the first clock CLK1 is at the low voltage 0V and the inverse first clock $\overline{CLK1}$ is at the high voltage VCC. Meanwhile, because the voltage of the node B (the first terminal of the second capacitor 1044) is at a high voltage 2VCC, the fourth N-type metal-oxide-semiconductor transistor 30224 is turned on, resulting in the second voltage V2 being transmitted to the node A. That is to say, the voltage of the node A is at the high voltage VCC. Meanwhile, the first capacitor 1024 stores a voltage drop (VCC). In addition, as shown in FIG. 3 and FIG. 4, because the inverse first clock $\overline{CLK1}$ is at the high voltage VCC, the seventh P-type metal-oxide-semiconductor transistor 30262 is turned off and the fifth N-type metal-oxide-semiconductor transistor 30282 is turned on, resulting in third voltage V3 being transmitted to the third terminal of the seventh P-type metal-oxide-semiconductor transistor 30262. That is to say, the first double-swing clock FDSCLK is at the low voltage 0V. As shown in FIG. 3 and FIG. 4, at a period T2 (a pumping period of the double-swing clock generator 300), the first clock CLK1 is at the high voltage VCC and the inverse first clock $\overline{CLK1}$ is at the low voltage 0V. Because the first capacitor 1024 stores the voltage drop (VCC), when the first clock CLK1 is changed from the low voltage 0V to the high voltage VCC, the voltage of the node A can be boosted to the first high voltage 2VCC to maintain the voltage drop (VCC) stored in the first capacitor 1024. In addition, because the voltage of the node B is at the high voltage VCC and the voltage of the node A is at the first high voltage 2VCC, the third N-type metal-oxide-semiconductor transistor 30222 and the fourth N-type metal-oxide-semiconductor transistor 30224 are turned off. In addition, as shown in FIG. 3 and FIG. 4, because the inverse first clock $\overline{CLK1}$ is at the low voltage 0V, the seventh P-type metal-oxide-semiconductor transistor 30262 is turned on and the fifth N-type metal-oxide-semiconductor transistor 30282 is turned off, resulting in the voltage of the node A (2VCC) being transmitted to the third terminal of the seventh P-type metal-oxide-semiconductor transistor 30262. That is to say, the first double-swing clock FDSCLK is at the first high voltage 2VCC. Thus, a swing of the first double-swing clock FDSCLK is equal to 2VCC. That is to say, a low voltage level of the first double-swing clock FDSCLK is at the first low voltage 0V, and a high voltage level of the first double-swing clock FDSCLK is at the first high voltage 2VCC. In addition, operational principles of the second double-swing clock SDSCLK are the same as those of the first double-swing clock FDSCLK, so further description thereof is omitted for simplicity.

In addition, in another embodiment of the present invention, the second terminal of the fourth N-type metal-oxide-semiconductor transistor 30224 is used for coupling to a second output terminal of a charge pump unit of a charge pump unit chain, and the second terminal of the sixth N-type metal-oxide-semiconductor 30422 is used for coupling to a first output terminal of the charge pump unit.

Figure 5:
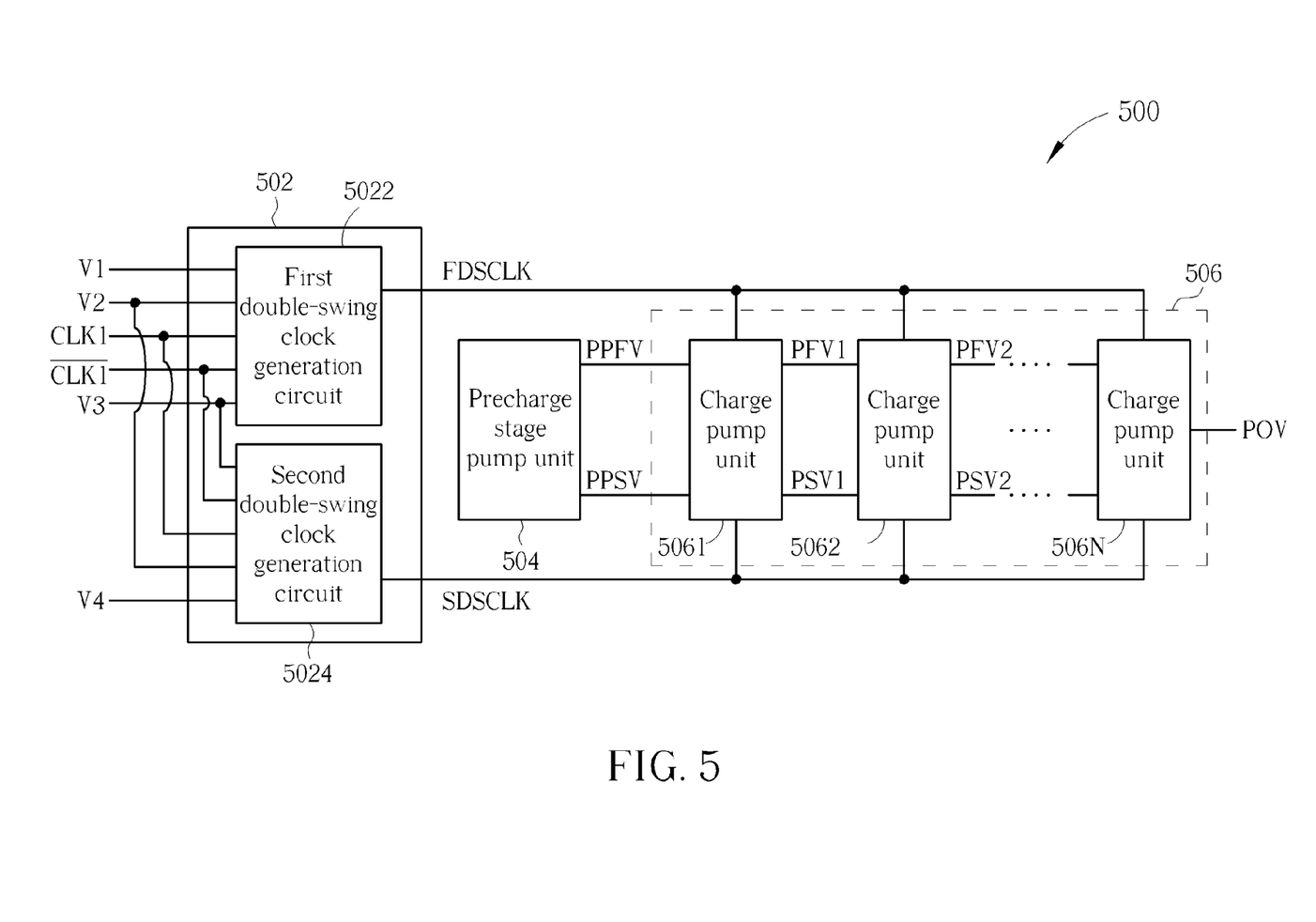
FIG. 5 is a diagram illustrating a charge pump according to another embodiment.

Please refer to FIG. 5. FIG. 5 is a diagram illustrating a charge pump 500 according to another embodiment. The charge pump 500 includes a double-swing clock generator 502, a precharge stage pump unit 504, and a charge pump unit chain 506, where the double-swing clock generator 502 includes a first double-swing clock generation circuit 5022 and a second double-swing clock generation circuit 5024. The first double-swing clock generation circuit 5022 is used for receiving a first voltage V1, a second voltage V2, a first clock CLK1, an inverse first clock $\overline{CLK1}$, and a third voltage V3, and outputting a first double-swing clock FDSCLK. The second double-swing clock generation circuit 5024 is used for receiving a fourth voltage V4, the second voltage V2, the inverse first clock $\overline{CLK1}$, the first clock CLK1, and the third voltage V3, and outputting a second double-swing clock SDSCLK. In addition, because the double-swing clock generator 502 can be the double-swing clock generator 300 or the double-swing clock generator 100, subsequent operational principles of the double-swing clock generator 502 are omitted for simplicity. The precharge stage pump unit 504 is used for providing a pair of precharge pump voltages PPFV, PPSV, where the pair of precharge pump voltages PPFV, PPSV can be a pair of positive voltages or a pair of negative voltages. The charge pump unit chain 506 includes a plurality of charge pump units 5061-506N, where N is an integer. But, the present invention is not limited to the charge pump unit chain 506 including the plurality of charge pump units 5061-506N. That is to say, the charge pump unit chain 506 can only include a charge pump unit. The charge pump unit chain 506 is used for receiving the first double-swing clock FDSCLK, the second double-swing clock SDSCLK, the pair of precharge pump voltages PPFV, PPSV, and outputting a charge pump output voltage POV.

As shown in FIG. 5, the first stage charge pump unit 5061 of the plurality of charge pump units 5061-506N is used for receiving the first double-swing clock FDSCLK, the second double-swing clock SDSCLK, the pair of precharge pump voltages PPFV, PPSV, and outputting a pair of first pump voltages PFV1, PSV1. The $N^{th}$ stage charge pump unit 506N is used for receiving the first double-swing clock FDSCLK, the second double-swing clock SDSCLK, a pair of $(N-1)^{th}$ pump voltages PFV(N-1), PSV(N-1), and outputting a pair of $N^{th}$ pump voltages PFVN, PSVN. For example, the second stage charge pump unit 5062 is used for receiving the first double-swing clock FDSCLK, the second double-swing clock SDSCLK, the pair of first pump voltages PFV1, PSV1, and outputting a pair of second pump voltages PFV2, PSV2. Because the charge pump output voltage POV is an output voltage of the $N^{th}$ stage charge pump unit 506N, the charge pump output voltage POV can be the pair of $N^{th}$ pump voltages PFVN, PSVN. That is to say, potential of the $N^{th}$ pump voltage PFVN is equal to potential of the $N^{th}$ pump voltage PSVN. In addition, the pair of first pump voltages PFV1, PSV1 can be a pair of positive voltages higher than the high voltage VCC or a pair of negative voltages lower than 0V.

To sum up, the double-swing clock generator and the charge pump utilize the first clock and the inverse first clock to generate the first double-swing clock and the second double-swing clock. Then, the charge pump can utilize the first double-swing clock and the second double-swing clock to control charge transfer of the charge pump unit chain. Therefore, the present invention has advantages as follows: first, when the high voltage is gradually decreased with an advanced metal-oxide-semiconductor process, the charge pump can still maintain a good charge transfer characteristic; second, during power-up of the charge pump, the charge pump has a better ability of outputting charges; third, efficiency of a first pumping cycle of the charge pump is the same as efficiency of another pumping cycle of the charge pump; fourth, the charge pump does not need devices with a low threshold voltage to overcome corner cases of a semiconductor process; fifth, the charge pump does not need wider devices, that is, devices of the charge pump have a smaller area and a parasitic capacitor, so pump efficiency of the charge pump can be increased; sixth, the charge pump does not need a level shifter; and seventh, the charge pump does not need devices fabricated by a special semiconductor process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A double-swing clock generator, comprising:
   a first double-swing clock generation circuit for receiving a first voltage, a second voltage, a first clock, an inverse first clock, and a third voltage, and outputting a first double-swing clock, wherein a swing of the first double-swing clock is two times to a swing of the first clock, the first double-swing clock generation circuit comprising:
   a first precharge unit for receiving the first voltage and the second voltage;

a first capacitor coupled to the first precharge unit for receiving the first clock;
a first charge transfer unit coupled to the first precharge unit for receiving the inverse first clock and outputting the first double-swing clock; and
a second precharge unit coupled to the first charge transfer unit for receiving the third voltage; and
a second double-swing clock generation circuit for receiving a fourth voltage, the second voltage, the inverse first clock, the first clock, and the third voltage, and outputting a second double-swing clock, wherein a swing of the second double-swing clock is two times to the swing of the first clock, the second double-swing clock generation circuit comprising:
a third precharge unit for receiving the fourth voltage and the second voltage;
a second capacitor coupled to the third precharge unit for receiving the inverse first clock;
a second charge transfer unit coupled to the third precharge unit for receiving the first clock and outputting the second double-swing clock; and
a fourth precharge unit coupled to the second charge transfer unit for receiving the third voltage.

2. The double-swing clock generator of claim 1, wherein: the first precharge unit comprises:
a first P-type metal-oxide-semiconductor transistor having a first terminal for receiving the second voltage, a second terminal coupled to the first terminal of the first P-type metal-oxide-semiconductor, a third terminal coupled to the first terminal of the first capacitor, and a fourth terminal for receiving the first voltage; and
a second P-type metal-oxide-semiconductor transistor having a first terminal for receiving the second voltage, a second terminal, a third terminal coupled to the first terminal of the first capacitor, and a fourth terminal for receiving the first voltage;
the first charge transfer unit comprises:
a first N-type metal-oxide-semiconductor transistor having a first terminal coupled to the first terminal of the first capacitor, a second terminal for receiving the inverse first clock, a third terminal for outputting the first double-swing clock, and a fourth terminal coupled to the first terminal of the first N-type metal-oxide-semiconductor; and
the second precharge unit comprises:
a third P-type metal-oxide-semiconductor transistor having a first terminal coupled to the third terminal of the first N-type metal-oxide-semiconductor, a second terminal coupled to the second terminal of the first N-type metal-oxide-semiconductor, a third terminal for receiving the third voltage, and a fourth terminal coupled to the third terminal of the third P-type metal-oxide-semiconductor.

3. The double-swing clock generator of claim 2, wherein: the third precharge unit comprises:
a fourth P-type metal-oxide-semiconductor transistor having a first terminal for receiving the second voltage, a second terminal, a third terminal coupled to the first terminal of the second capacitor, and a fourth terminal for receiving the fourth voltage; and
a fifth P-type metal-oxide-semiconductor transistor having a first terminal for receiving the second voltage, a second terminal coupled to the first terminal of the fifth P-type metal-oxide-semiconductor, a third terminal coupled to the first terminal of the second capacitor, and a fourth terminal for receiving the fourth voltage;
the second charge transfer unit comprises:
a second N-type metal-oxide-semiconductor transistor having a first terminal coupled to the first terminal of the second capacitor, a second terminal for receiving the first clock, a third terminal for outputting the second double-swing clock, and a fourth terminal coupled to the first terminal of the second N-type metal-oxide-semiconductor; and
the fourth precharge unit comprises:
a sixth P-type metal-oxide-semiconductor transistor having a first terminal for receiving the third voltage, a second terminal coupled to the second terminal of the second N-type metal-oxide-semiconductor, a third terminal coupled to the third terminal of the second N-type metal-oxide-semiconductor, and a fourth terminal coupled to the first terminal of the sixth P-type metal-oxide-semiconductor.

4. The double-swing clock generator of claim 3, wherein the second terminal of the second P-type metal-oxide-semiconductor transistor is used for coupling to a second output terminal of a charge pump unit, and the second terminal of the fourth P-type metal-oxide-semiconductor transistor is used for coupling to a first output terminal of the charge pump unit.

5. The double-swing clock generator of claim 3, wherein the second terminal of the second P-type metal-oxide-semiconductor transistor is coupled to the third terminal of the fourth P-type metal-oxide-semiconductor, and the second terminal of the fourth P-type metal-oxide-semiconductor transistor is coupled to the third terminal of the first P-type metal-oxide-semiconductor.

6. The double-swing clock generator of claim 1, wherein the second voltage is a low voltage and the third voltage is a high voltage.

7. The double-swing clock generator of claim 1, wherein the first voltage is a high voltage or the first clock, and the fourth voltage are the high voltage or the inverse first clock.

8. The double-swing clock generator of claim 1, wherein: the first precharge unit comprises:
a third N-type metal-oxide-semiconductor transistor having a first terminal for receiving the second voltage, a second terminal coupled to the first terminal of the third N-type metal-oxide-semiconductor, a third terminal coupled to the first terminal of the first capacitor, and a fourth terminal for receiving the first voltage; and
a fourth N-type metal-oxide-semiconductor transistor having a first terminal for receiving the second voltage, a second terminal, a third terminal coupled to the first terminal of the first capacitor, and a fourth terminal for receiving the first voltage;
the first charge transfer unit comprises:
a seventh P-type metal-oxide-semiconductor transistor having a first terminal coupled to the first terminal of the first capacitor, a second terminal for receiving the inverse first clock, a third terminal for outputting the first double-swing clock, and a fourth terminal coupled to the first terminal of the seventh P-type metal-oxide-semiconductor; and
the second precharge unit comprises:
a fifth N-type metal-oxide-semiconductor transistor having a first terminal coupled to the third terminal of the seventh P-type metal-oxide-semiconductor, a second terminal coupled to the second terminal of the seventh P-type metal-oxide-semiconductor, a third terminal for receiving the third voltage, and a fourth terminal coupled to the third terminal of the fifth N-type metal-oxide-semiconductor.

9. The double-swing clock generator of claim 8, wherein: the third precharge unit comprises:
- a sixth N-type metal-oxide-semiconductor transistor having a first terminal for receiving the second voltage, a second terminal, a third terminal coupled to the first terminal of the second capacitor, and a fourth terminal for receiving the fourth voltage; and
- a seventh N-type metal-oxide-semiconductor transistor having a first terminal for receiving the second voltage, a second terminal coupled to the first terminal of the seventh N-type metal-oxide-semiconductor transistor, a third terminal coupled to the first terminal of the second capacitor, and a fourth terminal for receiving the fourth voltage;

the second charge transfer unit comprises:
- an eighth P-type metal-oxide-semiconductor transistor having a first terminal coupled to the first terminal of the second capacitor, a second terminal for receiving the first clock, a third terminal for outputting the second double-swing clock, and a fourth terminal coupled to the first terminal of the eighth P-type metal-oxide-semiconductor; and the fourth precharge unit comprises:
- an eighth N-type metal-oxide-semiconductor transistor having a first terminal for receiving the third voltage, a second terminal coupled to the second terminal of the eighth P-type metal-oxide-semiconductor transistor, a third terminal coupled to the third terminal of the eighth P-type metal-oxide-semiconductor, and a fourth terminal coupled to the first terminal of the eighth N-type metal-oxide-semiconductor.

10. The double-swing clock generator of claim 9, wherein the second terminal of the fourth N-type metal-oxide-semiconductor transistor is used for coupling to a second output terminal of a charge pump unit, and the second terminal of the sixth N-type metal-oxide-semiconductor transistor is used for coupling to a first output terminal of the charge pump unit.

11. The double-swing clock generator of claim 9, wherein the second terminal of the fourth N-type metal-oxide-semiconductor transistor is coupled to the third terminal of the sixth N-type metal-oxide-semiconductor, and the second terminal of the sixth N-type metal-oxide-semiconductor transistor is coupled to the third terminal of the third N-type metal-oxide-semiconductor.

12. The double-swing clock generator of claim 8, wherein the second voltage is a high voltage and the third voltage is a low voltage.

13. The double-swing clock generator of claim 8, wherein the first voltage is a low voltage or the first clock, and the fourth voltage are the low voltage or the inverse first clock.

14. A charge pump, comprising:
- a double-swing clock generator comprising:
  - a first double-swing clock generation circuit for receiving a first voltage, a second voltage, a first clock, an inverse first clock, and a third voltage, and outputting a first double-swing clock; and
  - a second double-swing clock generation circuit for receiving a fourth voltage, the second voltage, the inverse first clock, the first clock, and the third voltage, and outputting a second double-swing clock;
- a precharge stage pump unit for providing a pair of precharge pump voltages; and
- a charge pump unit chain comprising at least one charge pump unit, wherein the charge pump unit chain is used for receiving the first double-swing clock, the second double-swing clock, the pair of precharge pump voltages, and outputting a charge pump output voltage.

15. The charge pump of claim 14, wherein the at least one charge pump unit comprises:
- a first stage charge pump unit for receiving the first double-swing clock, the second double-swing clock, the pair of precharge pump voltages, and outputting a pair of first pump voltages; and
- an $N^{th}$ stage charge pump unit for receiving the first double-swing clock, the second double-swing clock, a pair of $(N-1)^{th}$ pump voltages, and outputting a pair of $N^{th}$ pump voltages;

wherein $N \geq 2$, and N is an integer.

16. The charge pump of claim 15, wherein the charge pump output voltage is the pair of $N^{th}$ pump voltages.

* * * * *